(12) United States Patent
Centola et al.

(10) Patent No.: US 6,674,643 B2
(45) Date of Patent: Jan. 6, 2004

(54) THERMAL CONNECTOR FOR TRANSFERRING HEAT BETWEEN REMOVABLE PRINTED CIRCUIT BOARDS

(75) Inventors: Bruno Centola, Vence (FR); Claude Gomez, Antibes (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/211,718

(22) Filed: Aug. 1, 2002

(65) Prior Publication Data

US 2003/0030986 A1 Feb. 13, 2003

(30) Foreign Application Priority Data

Aug. 9, 2001 (EP) ............................................. 01480071

(51) Int. Cl.[7] ................................................. H05K 7/20
(52) U.S. Cl. ..................... 361/720; 62/259.2; 165/80.4; 165/104.33; 174/15.2; 361/700; 361/699
(58) Field of Search ............... 62/259.2; 165/80.2–80.4, 165/104.32–104.34, 104.21–104.23; 174/15.2; 257/714; 361/687–689, 698–703, 717–722

(56) References Cited

U.S. PATENT DOCUMENTS

| | | | | |
|---|---|---|---|---|
| 5,099,254 A | * | 3/1992 | Tsukii et al. ................. 361/699 |
| 5,343,358 A | | 8/1994 | Hilbrink | |
| 5,808,869 A | * | 9/1998 | Donahoe et al. ............. 361/700 |
| 5,886,872 A | * | 3/1999 | Koenen et al. .............. 361/719 |
| 5,898,569 A | * | 4/1999 | Bhatia ......................... 361/700 |
| 5,946,191 A | | 8/1999 | Oyamada | |
| 6,111,751 A | * | 8/2000 | Sakuyama ................... 361/700 |
| 6,118,654 A | * | 9/2000 | Bhatia ......................... 361/700 |
| 6,137,682 A | * | 10/2000 | Ishimine et al. ............ 361/700 |
| 6,181,553 B1 | * | 1/2001 | Cipolla et al. .............. 361/687 |
| 6,349,035 B1 | * | 2/2002 | Koenen ....................... 361/719 |

\* cited by examiner

Primary Examiner—Gregory Thompson
(74) Attorney, Agent, or Firm—William H. Steinberg

(57) ABSTRACT

A thermal connector to transfer heat from one PCB to another, without interfering with the convenient removal and replacement of the PCBs and without increasing the force required to connect or deconnect the PCBs. The thermal connector comprises a first part, fixedly attached to one PCB and thermally coupled to the end portion of a first heat pipe (thermally coupled to the device to be cooled) and a second movable part, adapted to firmly grasp the end portion of the first pipe and a second heat pipe thermally connected to a cooling system.

7 Claims, 3 Drawing Sheets

THERMAL CONNECTOR FOR TRANSFERRING HEAT BETWEEN REMOVABLE PRINTED CIRCUIT BOARDS

FIELD OF THE INVENTION

The present invention relates to an apparatus for cooling electronic devices and more particularly to thermal connectors adapted for efficiently transferring heat from one printed circuit board (PCB) to another PCB (or housing) without interfering with the convenient removal and replacement of the PCBs.

BACKGROUND OF THE INVENTION

The relentless quest for performance has driven the clock frequency used in commercially available parts such as microprocessors to values expressed in hundreds of megahertz and in their laboratory counterparts to values expressed in gigahertz. Also, the dramatic increase of the level of integration that has been achieved in recent years, allowing millions of transistors to be positioned on a single piece of semiconductor, results in generated heat that must be dissipated to avoid damaging or destroying electronic devices and to reach higher performance. Such a situation is typically encountered in the field of telecommunications where complex circuitry uses high speed clocks function 24 hours a day, 7 days a week.

Commonly, the provisions made for cooling electronic devices include the use of heat sinks which provide cooling in an air stream. However, since the power consumption of electronic devices increases, the use of active cooling may advantageously replace such air cooling. Such a solution provides better cooling and allows positioning of multiple electronic devices close enough to one another to avoid undesirable long signal path lengths. For example, the use of heat pipes allows the electronic device to be cooled to be moved away from the cooling system. Likewise, the use of heat pipes allows the cooling of several electronic devices with a single central cooling system.

On the other hand, PCBs are well adapted for electrical system evolution to simplify maintenance and other tasks and thus, are a common form of electrical circuit packaging. Today, many electrical systems like computers, routers and switchers are based on a housing containing a backplane comprising active devices and at least one slot to connect a PCB. PCBs are linked to the backplane with connectors, located on the electronic board lower edge and backplane surface, through which signals are transmitted. Since PCBs generally contain active electronic devices, each PCB needs its own cooling system or a shared one. The solution of embedding a cooling system on each PCB leads to several drawbacks. The multiple cooling systems localized on the PCBs are space consuming and, generally, the provided cooling is not efficient when several PCBs are connected close together. When the cooling system is shared between all the connected PCBs, heat must be transferred efficiently from one PCB to another and eventually outside the housing, including without interfering with the convenient removal and replacement of the PCBs.

U.S. Pat. No. 5,343,358 discloses an arrangement for cooling electronic components in a system. Several circuit boards are connected to a backplane electrically and through heat pipes, which are mounted on the boards and provide connections between the electronic components on the boards and the cooling system. The circuit boards, including the attached heat pipes, can be removed from the backplane by detaching electrical connections on the boards from corresponding connectors on the backplane, while at the same time detaching the ends of the heat pipes from sockets in an expander which forms part of the cooling system. If desired, backplanes can be positioned on both sides of the expander, with sockets provided on both sides of the expander to receive end portions of heat pipes.

U.S. Pat. No. 5,946,191 discloses a heat sink structure for an electronic device of the type having a chassis and a plug-in unit, for providing heat dissipation for a heat-generating component on a PCB within the unit as shown on FIG. 1. In a preferred embodiment, a first heat pipe is fixedly attached to a heat dissipating plate for the heat generating component. At the opposite end, the first heat pipe is held by a connector plug attached to the unit. At one end, a second heat pipe is held by a plug-receiving seat that is fixedly attached to a backboard of the chassis. At the opposite end, the second heat pipe is fixedly attached to a heat dissipating portion on the chassis. The first heat pipe, plug, plug-receiving seat and second heat pipe transfer heat from the heat-generating component to the heat-dissipating portion.

In the above mentioned U.S. patents, thermal connection between a PCB and another one or a housing is provided by mechanical pressure using a springy system. Thus, when a PCB is inserted or extracted, a mechanical constraint is exerted on the heat pipes and the efficiency of thermal contacts depends upon the constraint exerted. This could lead to damage the heat pipes or the electrical connectors, in particular when the number of electrical contacts is significant, as in many of today's switching systems.

OBJECTS AND SUMMARY OF THE INVENTION

It is a primary object of this invention to provide an improved thermal connector for use in electronic assemblies utilizing PCBs.

It is another object of the invention to provide a thermal connector that will provide efficient heat transfer between a first PCB and a heat pipe associated with a second PCB.

It is still another object of the invention to provide such a thermal connector that will function effectively with PCBs that are connectable and separable without interfering with the convenient removal and replacement of such PCBs.

According to one aspect of the invention, there is provided a thermal connector to transfer heat between a first PCB having a device to be cooled thereon and a first heat pipe, and a second PCB having a second heat pipe, the first and second PCBs being connectable and separable, the thermal connector comprising a first part comprised of thermally conductive material attached to the first PCB and thermally connected to the device to be cooled on the first PCB by the first heat pipe, a second part movably positioned relative to the first part so as to occupy a first open position and a second closed position relative thereto, the first and second parts engaging both the first and second heat pipes while the second part occupies the second position so as to provide an effective heat transfer path from the first pipe to the second pipe, and the first and second parts enabling removal of the second pipe while the second part occupies the first position so as to assure facile separation of the first and second heat pipes.

Further advantages of the present invention will become apparent to the ones skilled in the art upon examination of the drawings and detailed description. It is intended that any additional advantages be incorporated herein.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals may be used to indicate like elements from Figure to Figure.

The preferred embodiment of the invention concerns cooling of printed circuit boards for routing or switching systems that require great numbers of active electrical devices running at high speed. In the following description, PCBs are connected to a backplane comprising a central cooling system. Nevertheless, it is to be understood that the invention can be utilized with various other kinds of systems using independent and removable boards and cooling systems.

Figure 1:
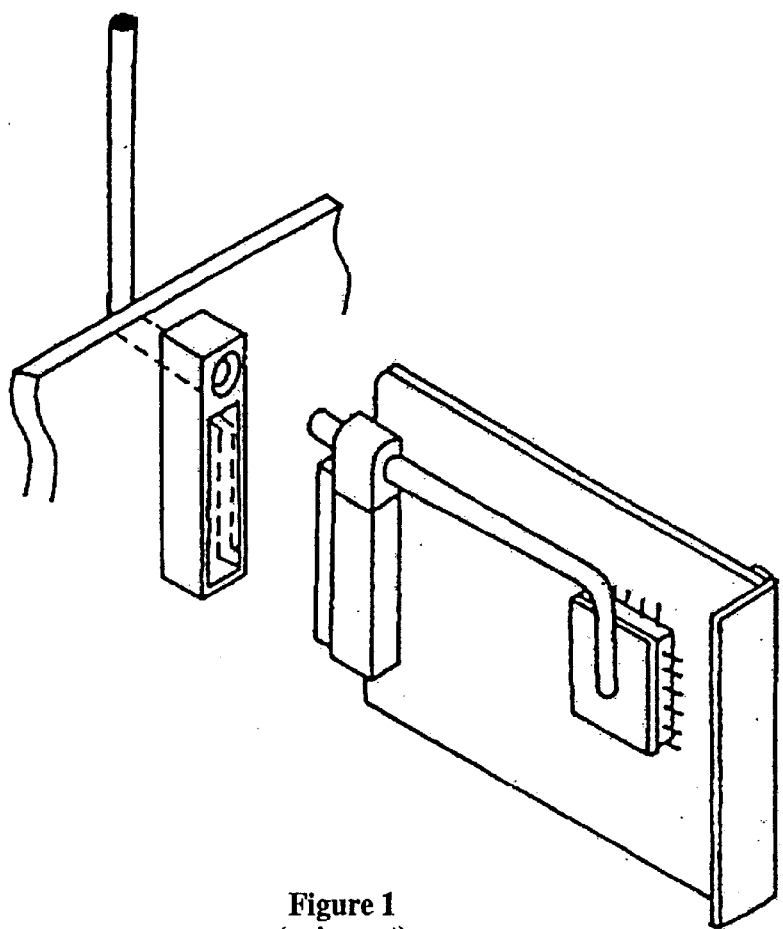
FIG. 1 shows a thermal connection system between a PCB and a housing as shown and described in U.S. Pat. No. 5,946,191.
Figure 2:
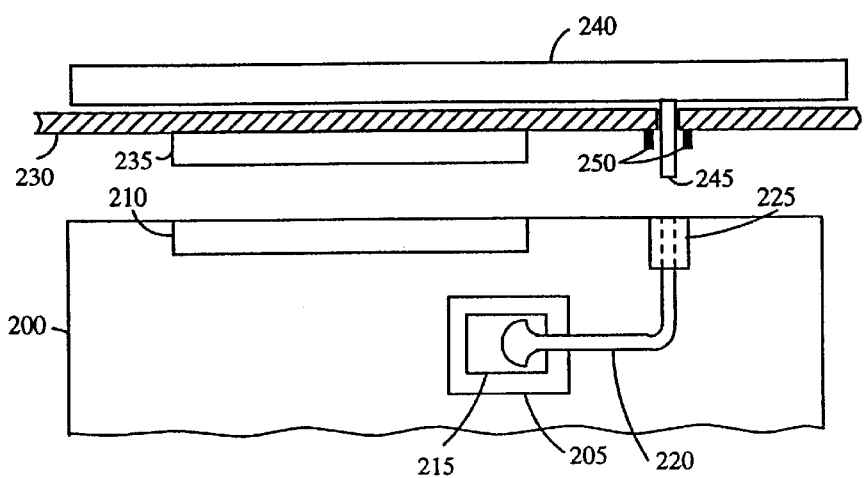
FIG. 2 depicts a top view of a thermal connection system between a PCB and a housing system, using a thermal connector of the instant invention.
Figure 3:
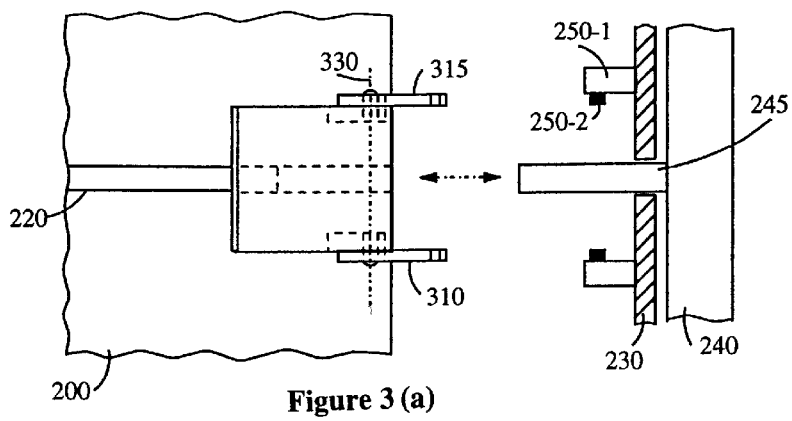
FIGS. 3a, 3b, 3c and 3d illustrate one embodiment of a thermal connector according to the invention, in much greater detail than shown in FIG. 2.
Figure 3:
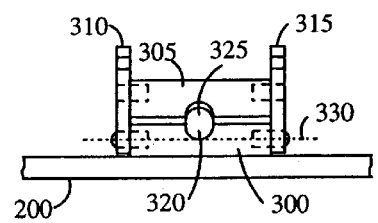
Figure 3:
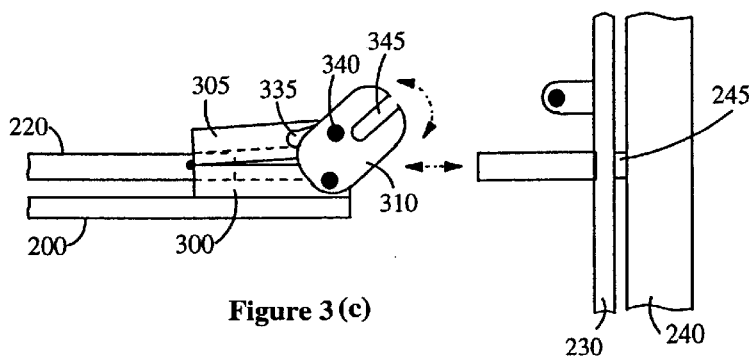
Figure 4:
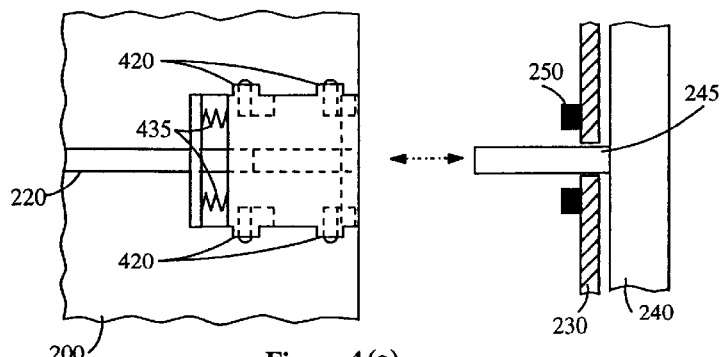
FIGS. 4a, 4b, 4c and 4d illustrate a second embodiment of a thermal connector according to the invention, again in much greater detail than in FIG. 2.
Figure 4:
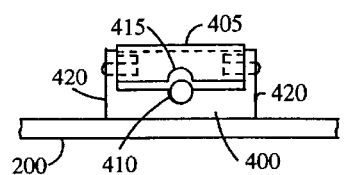
Figure 5:
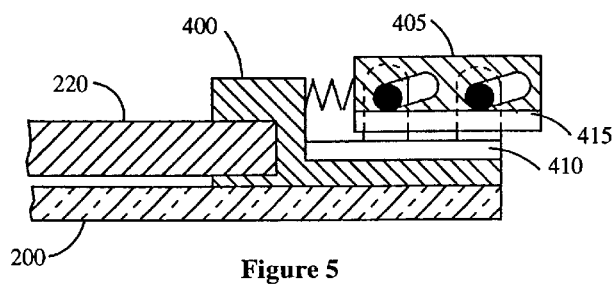
FIG. 5 illustrates an alternative example of the thermal connector shown in FIGS. 4a–d.

With reference now to the drawing, and particularly to FIG. 2, there is shown a PCB 200 comprising a heat-generating electronic device 205 that needs to be cooled and an electrical connector 210 located on an edge of PCB 200. Electronic device 205 comprises a heat dissipating plate 215 to which the heat-receiving end portion of a heat pipe 220 is thermally coupled. At its heat-dissipating end portion, heat pipe 220 is thermally coupled to a thermal connector 225. Thermal connector 225, shown in much greater detail in FIGS. 3, 4 and 5, is fixedly attached to PCB 200. PCB 200 is adapted to be plugged into a backplane 230 comprising an electrical connector 235 that mates with electrical connector 210. Backplane 230 comprises a central cooling system 240 disposed on its opposite side from electrical connector 235. The heat-dissipating end portion of heat pipe 245 is thermally coupled to central cooling system 240 and its heat-receiving end portion is adapted to be engaged in thermal connector 225 of PCB 200. On the illustrated example, a hole has been formed in backplane 230 so that heat pipe 245 can be thermally coupled to central cooling system 240 and thermal connector 225. In a preferred embodiment, backplane 230 further comprises mechanical locking devices 250, localized close to heat pipe 245, that are adapted to couple to thermal connector 225. Thermal connector 225 comprises at least one mobile part cooperating with mechanical locking devices 250 so as to firmly grasp the heat-receiving end portion of heat pipe 245, thus providing an efficient heat transfer between heat pipes 220 and 245. It is to be noticed that a thermal insulative layer may be inserted between backplane 230 and central cooling system 240. Likewise, thermal connector 225 may be installed on the backplane.

Figure 3D:
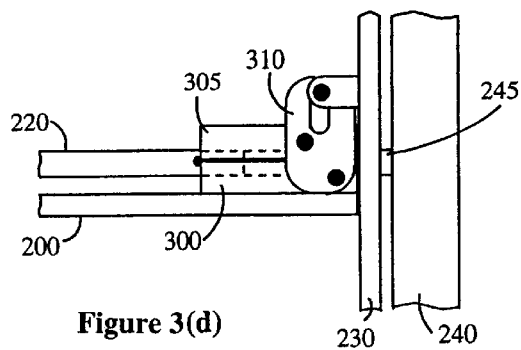

FIGS. 3a, 3b, 3c and 3d, illustrate one embodiment of a thermal connector according to the invention. Like numerals are used to identify similar parts in FIGS. 2–5. FIGS. 3a, 3b and 3c represent respectively the upper view, front view and side view of the thermal connection mechanism between the heat-dissipating end portion of heat pipe 220 and the corresponding heat-receiving end portion of heat pipe 245. FIG. 3d shows this thermal connection as completed. The thermal connector comprises several parts referred to as 300, 305, 310 and 315 in FIG. 3. Parts 300 and 305, made of thermally conductive material such as copper, comprise channels 320 and 325 so as to firmly grasp the heat-receiving end portion (facing the connector) of heat pipe 245. Part 300 is fixedly attached to PCB 200 and thermally coupled to heat-dissipating end portion of heat pipe 220, e.g. heat-dissipating end portion of heat pipe 220 is engaged in channels 320 and 325. Fixed part 300 can be soldered or glued to PCB 200. Other standard solutions as screws or rivets may also be used. Part 305 is mobile (movable) relative to fixed part 300 so that channels 320 and 325 may be separated (spread apart at one end) and the heat-receiving end portion of heat pipe 245 can thus be freely inserted within or withdrawal from the hole (opening) formed by channels 320 and 325. Parts 300 and 305 are linked with a hinge mechanism. Movement of part 305 is controlled by arms 310 and 315 to lock or unlock heat-receiving end portion of heat pipe 245 in channels 320 and 325. Arms 310 and 315 rotate along axis 330 and comprise pins 340 (FIG. 3c) cooperating with elongated holes 335 (FIG. 3c) of part 305. As seen in FIG. 3c, this movement allows each arm to be pivotally located on the lower, fixed part 300. (See the curved directional arrow indicating such pivotal movement.) Arms 310 and 315 further comprise elongated holes 345 for cooperating with two spaced mechanical locking devices 250 each formed of an arm 250-1 and a pin 250-2. When PCB 200 is not connected, arms 310 and 315 are in a first position where channels 320 and 325 are separated, allowing heat pipe 245 to be engaged in the formed hole, as illustrated on FIG. 3c. When PCB 200 is inserted into backplane 230, pins 250-2, each cooperating with a respective one of the elongated holes 345, push arms 310 and 315 to cause part 305 to close onto part 300 so as to firmly grasp heat-receiving end portion of heat pipe 245. FIG. 3d shows the state of thermal connector 225 when PCB 200 is connected to backplane 230. As seen therein, pipe 220 and pipe 245 are firmly retained by the two metallic (copper) parts 300 and 305, which surround both pipes and form a sound thermal connection therewith. Effective heat transfer from pipe 220 to pipe 245 is thus assured.

It is understood that various alternatives of the embodiment described by reference to FIG. 3 are possible. For example, a hinge or spring mechanism could be located on a side of parts 300 and 305 instead of an arm, e.g. 315, so as to use only one arm, e.g. 310, and thus one mechanical locking device 250.

Figure 4C:
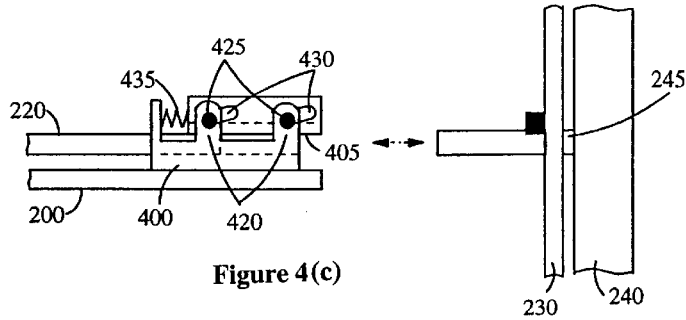
Figure 4D:
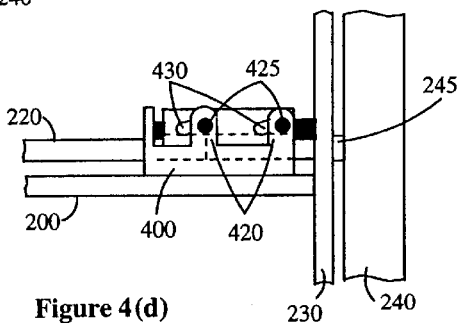

FIGS. 4a, 4b, 4c and 4d illustrate a second embodiment of a thermal connector according to the invention. FIGS. 4a, 4b and 4c represent respectively the upper view, front view and side view of the thermal connection mechanism between heat-dissipating end portion of heat pipe 220 and heat-receiving end portion of heat pipe 245. FIG. 4d shows the thermal connection mechanism between heat-dissipating end portion of heat pipe 220 and heat-receiving end portion of heat pipe 245 when both are coupled together. The thermal connector of FIGS. 4a–4d mainly comprises two parts 400 and 405 made of thermally conductive material such as aluminum wherein channels 410 and 415 define a hole adapted to firmly grasp heat-receiving end portion of heat pipe 245. Part 400 is fixedly mounted on PCB 200 and thermally connected to heat-dissipating end portion of heat pipe 220, e.g. heat-dissipating end portion of heat pipe 220 is engaged in channels 410 and 415, while movable part 405 is locked onto part 400 (see more below). As mentioned above concerning fixed part 300, fixed part 400 can be soldered or glued to PCB 200 and other standard solutions such as screws or rivets may be used. Part 400 comprises supports 420 having pins 425 that cooperate with elongated holes 430 of part 405 so that channels 410 and 415 may be separated to freely insert or remove heat pipe 245. Channels 410 and 415 are brought close together to firmly grasp heat-receiving end portion of head pipe 245 when movable part 405 is pressed downwardly on part 400. Spring 435 may be used to separate parts 400 and 405 when PCB 200 is not connected, as illustrated on FIG. 4c, to thereby easily engage heat-receiving end portion of heat pipe 245 in the hole formed by channels 410 and 415. When PCB 200 is connected to backplane 230, mechanical locking devices 250 push against part 405 to move it onto part 400 and firmly grasp heat-receiving end portion of heat pipe 245, as illustrated in FIG. 4d. Part 405 thus laterally moves relative to bottom part 400 while at the same time moving downwardly to engage pipe 200 to, working with part 400, compress both of the pipes and forms a second thermal connection between both pipes.

It will be obvious for one skilled in the art that mechanical locking device 250, which is shown as a projecting arm in FIG. 4a, may be replaced by a spring with elasticity less than the elasticity of spring 435 to provide both efficient electrical and thermal contacts without boards and connectors when PCB 200 is inserted. As it is observable from FIG. 4b, the mechanical locking device may be not required when part 405 goes beyond PCB 200 edge. In such case, part 405 may be pushed by backplane 230, omitting the need for device(s) 250. In other embodiments, the user may push part 405 himself. If parts 400 and 405 are made of thermally insulative material, thermal connection between heat pipes 220 and 245 has to be done through a physical contact of the heat-dissipating end portion of heat pipe 220 and heat-receiving end portion of heat pipe 245. In such case, the length of heat pipe 245 that go beyond backplane 230 must be adapted to the length of channels 410 and 415 that are adapted to grasp it and the length of heat-dissipating end portion of heat pipe 220 engaged in these channels.

FIG. 5 represents an alternative example of the thermal connector represented on FIG. 4, in which part 400 and preferably part 405 are made of thermally conductive material. Part 400 further comprises an enclosure adapted to receive heat-dissipating end portion of heat pipe 220 so as to thermally couple heat-dissipating end portion of heat pipe 220 and part 400. The shapes of heat-dissipating end portion of heat pipe 220 and heat-receiving end portion of heat pipe 245 may be different. In this example, the invention's thermal connector is placed on PCB 200 so that mechanical locking device 250 is not required. Part 405 is simply pushed (depressed) by backplane 230 when PCB 200 is connected to firmly grasp heat pipe 245 in channels 410 and 415.

While there have been shown and described what are at present the preferred embodiments of the invention, it will be obvious to those skilled in the art that various changes and modifications may be made therein without departing from the scope of the invention as defined by the appended claims.

What is claimed is:

1. A thermal connector for transferring heat between a first PCB having a device to be cooled thereon and a first heat pipe, and a second PCB having a second heat pipe, said first and second PCBs being connectable and separable, said thermal connector comprising:
   a first part comprised of thermally conductive material attached to said first PCB and thermally connected to said device to be cooled on said first PCB by said first heat pipe;
   a second part movably positioned relative to said first part so as to occupy a first open position and a second closed position relative thereto;
   said first and second parts engaging both said first and second heat pipes while said second part occupies said second position so as to provide an effective heat transfer path from said first pipe to said second pipe; and
   said first and second parts enabling removal of said second pipe while said second part occupies said first position so as to assure facile separation of said first and second heat pipes.

2. The thermal connector of claim 1 wherein said separation of said first and second heat pipes enables facile separation of said first and second PCBs.

3. The thermal connector of claim 1 further including at least one movable arm movably positioned on said first part and said second PCB includes at least one projecting arm, said at least one projecting arm adapted for engaging said at least one movable arm which in turn causes said second part to move to said second position such that both of said first and second parts engage said first and second heat pipes.

4. The thermal connector of claim 3 wherein said at least one movable arm includes an opening therein and said at least one projecting arm includes a pin, said pin being positioned within said opening when said at least one projecting arm engages said at least one movable arm to cause said second part to move to said second position.

5. The thermal connection of claim 4 wherein the number of movable arms is two and the number of projecting arms including a pin is two.

6. The thermal connector of claim 3 wherein said at least one movable arm is pivotally oriented on said second part.

7. The thermal connector of claim 1 wherein said second part laterally moves relative to said first part and in a downward direction toward said first part to engage said first and second pipes when said second part occupies said second position.

* * * * *